United States Patent
Lyons et al.

(10) Patent No.: US 6,624,642 B1
(45) Date of Patent: Sep. 23, 2003

(54) METAL BRIDGING MONITOR FOR ETCH AND CMP ENDPOINT DETECTION

(75) Inventors: Christopher F. Lyons, Fremont, CA (US); Ramkumar Subramanian, San Jose, CA (US); Steven C. Avanzino, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/016,252

(22) Filed: Dec. 10, 2001

(51) Int. Cl.[7] .............................................. G01R 27/00
(52) U.S. Cl. ................... 324/713; 324/716; 324/158.1; 324/671
(58) Field of Search ............................... 324/713, 765, 324/158.1, 537, 671, 71.5, 716

(56) References Cited

U.S. PATENT DOCUMENTS

| | | | |
|---|---|---|---|
| 4,801,869 A | * 1/1989 | Sprogis | 324/765 |
| 5,222,329 A | * 6/1993 | Yu | 51/165.57 |
| 5,337,015 A | * 8/1994 | Lustig et al. | 324/671 |
| 5,442,282 A | * 8/1995 | Restoker et al. | 324/158.1 |
| 5,643,050 A | * 7/1997 | Chen | 451/10 |
| 5,722,875 A | * 3/1998 | Iwashita et al. | 451/8 |
| 5,731,697 A | * 3/1998 | Li et al. | 324/71.5 |
| 6,015,333 A | 1/2000 | Obeng | 451/8 |
| 6,207,570 B1 | 3/2001 | Mucha | 438/692 |
| 6,347,977 B1 | * 2/2002 | Frost | 451/6 |

* cited by examiner

Primary Examiner—N. Le
Assistant Examiner—T. R. Sundaram
(74) Attorney, Agent, or Firm—Amin & Turocy, LLP

(57) ABSTRACT

Disclosed is a wafer containing a semiconductor substrate, at least one metal layer formed over the semiconductor substrate, and at least one electrical sensor embedded at least one of on and in the wafer to facilitate real time monitoring of the metal layer as it progresses through a subtractive metallization process. The system contains a wafer comprising at least one metal layer formed on a semiconductor substrate, at least one electrical sensor in contact with the wafer and operable to detect and transmit electrical activity associated with the wafer, and an electrical measurement station operable to process electrical activity detected and received from the electrical sensor for monitoring a subtractive metallization process in real-time.

14 Claims, 10 Drawing Sheets

METAL BRIDGING MONITOR FOR ETCH AND CMP ENDPOINT DETECTION

TECHNICAL FIELD

The present invention generally relates to processing a semiconductor substrate. In particular, the present invention relates to maximizing semiconductor device yield by utilizing a wafer-integrated monitoring system to adjust a metal etch process and/or a CMP process.

BACKGROUND ART

Achieving the objectives of miniaturization and higher packing densities continue to drive the semiconductor manufacturing industry toward improving semiconductor processing in every aspect of the fabrication process. One such aspect of the semiconductor fabrication process is subtractive metallization or metal etch processes. Metallization typically refers to forming metal layers, whereas subtractive metallization typically refers to removing metal to form conductive lines, interconnects, contact holes and plugs. In addition, subtractive metallization can also involve etching or chemical mechanical polishing (CMP) of the metal material in order to obtain desired thicknesses and structures. The CMP process removes or planarizes selected portions of the metal material. In both the metal etch and polishing processes, conventional endpoint detection techniques are often used to determine when the etch or polish is completed in order to prevent malformation of the desired structure or feature on the wafer. For example, prior art FIGS. 1–3 and 4–6 demonstrate malformed features on the wafers resulting from a metal etch process and a CMP process, respectively, wherein conventional endpoint detection techniques are employed.

FIGS. 1–3 illustrate a wafer 10 undergoing a metal etch process whereby the metal layer 12 which is formed over a substrate 14 is exposed to etch components 16. The resulting wafer structure 20 reveals incompletely etched conductive lines 22. In other words, metal material 24 continues to undesirably exist between the conductive lines 22. This excess metal material 24 may disform the wafer structure and impair proper semiconductor function.

Likewise, incomplete polishing of a metal material can also result in ineffective semiconductor function. FIGS. 4–6 illustrate a metal layer 32 formed over a series of trenches 34 between a dielectric material 31 on a substrate 30. The metal layer 32 undergoes a CMP process 36 to remove excess metal material, leaving metal only in the trenches (FIG. 5). However, incomplete polishing 38 resulting from faulty endpoint detection methods such as that shown in FIG. 6 can render the device inoperable or impaired. Thus, it is crucial to the operability of semiconductor devices to minimize insufficient or excessive processing of the wafer.

Conventional endpoint detection techniques are problematic for several reasons. For instance, they often are based on past wafer characteristics. Such methods cannot account for wafer to wafer structural and layer variations which commonly exist. As a result, conductive lines, interconnects, contacts holes and/or plugs are malformed and defective, causing device failure and decreased product yield as well as varying wafer-to-wafer quality. Although some damaged wafers may be repaired, such repairs delay manufacturing, increase production costs and decrease product reliability. In addition, conventional endpoint detection methods do not provide real time information relating to the current etch or polishing process.

In light of these problems, there is an unmet need for a monitoring system which may provide improved feature formation and endpoint detection.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention provides a novel monitoring system and method for endpoint detection with respect to metal etch and CMP processes. More specifically, the present invention provides a closed loop, real-time feedback system for detecting the endpoint of a given subtractive metallization process as the process progresses. For example, a metal etch process is substantially completed when no electrical activity is detected on the wafer or at the desired locations of the wafer. This is accomplished in part by employing electrical sensors embedded on and/or embedded in the wafer. The electrical sensors operate by detecting electrical activity within the wafer. In particular, the electrical sensors detect electrical activity such as current flow and resistance arising from the surrounding metal layer material formed on the wafer. As selected portions of the metal are etched, the sensors may continue to perform continuity tests and/or detect for electrical activity to determine the extent the etch process is completed. Likewise, the absence of electrical activity may be acknowledged in a similar manner. No electrical activity may be an indication that the metal material has been removed as desired. Before, during and following the subtractive metallization process, the electrical activity on the wafer may be monitored.

One aspect of the present invention relates to a system for monitoring a subtractive metallization process in real-time in order to effectuate an immediate response and modification in an on-going subtractive metallization process. The system contains a wafer comprising at least one metal layer formed on a semiconductor substrate, at least one electrical sensor in contact with the wafer and operable to detect and transmit electrical activity associated with the wafer, and an electrical measurement station operable to process electrical activity detected and received from the electrical sensor for monitoring a subtractive metallization process in real-time.

Another aspect of the present invention relates to a method for monitoring a subtractive metallization process in real-time includes providing a wafer comprising a layer of metal material formed over a semiconductor substrate, the wafer being in contact with at least one electrical sensor embedded at least one of on the wafer and in the wafer, subjecting the metal layer to a process selected from the group consisting of an etch process and a chemical mechanical polishing process, and determining the presence of electrical activity on the wafer to monitor the progression of the process in order to determine an endpoint of the process.

Yet another aspect of the present invention relates to a wafer which may be employed in the system and method described above. The wafer contains a semiconductor substrate, at least one metal layer formed over the semiconductor substrate, and at least one electrical sensor embedded at least one of on the wafer and in the wafer to facilitate real-time monitoring of the metal layer as it progresses through a subtractive metallization process.

DISCLOSURE OF INVENTION

Figure 1:
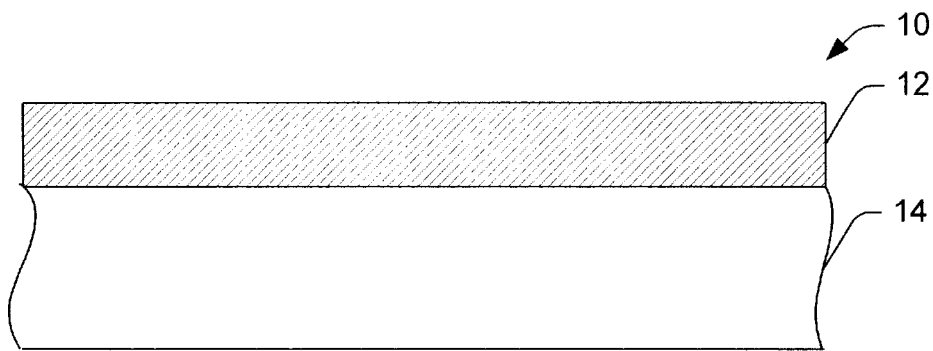
FIG. 1 illustrates a semiconductor substrate having a metal layer material formed thereon according to the prior art.
Figure 2:
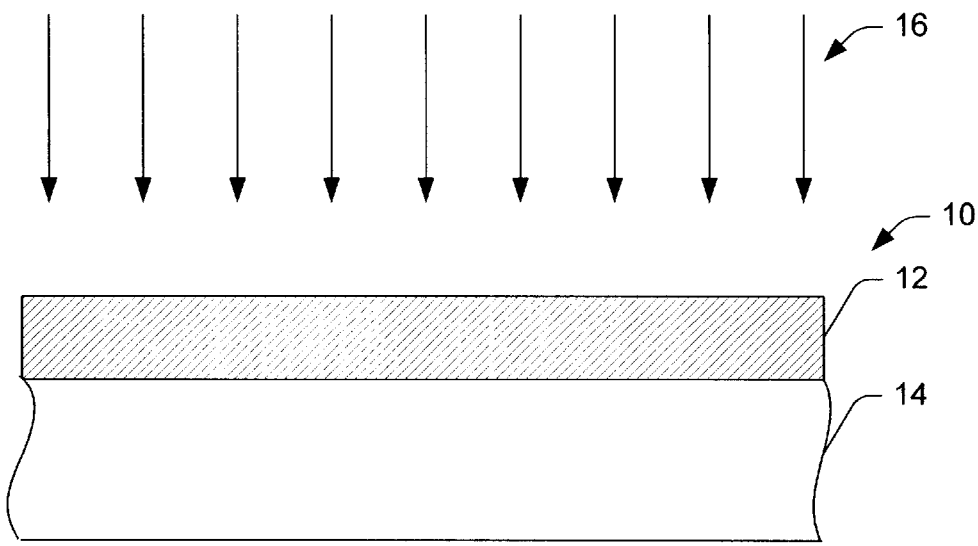
FIG. 2 illustrates the structure of FIG. 1 undergoing a subtractive metallization process according to a prior art metal etch process.
Figure 3:
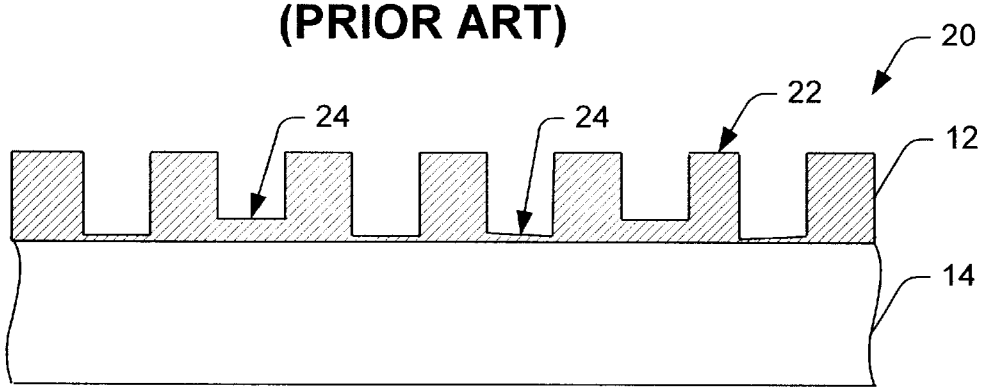
FIG. 3 illustrates the structure of FIG. 2 after the metal etch process has been substantially completely according to the prior art.
Figure 4:
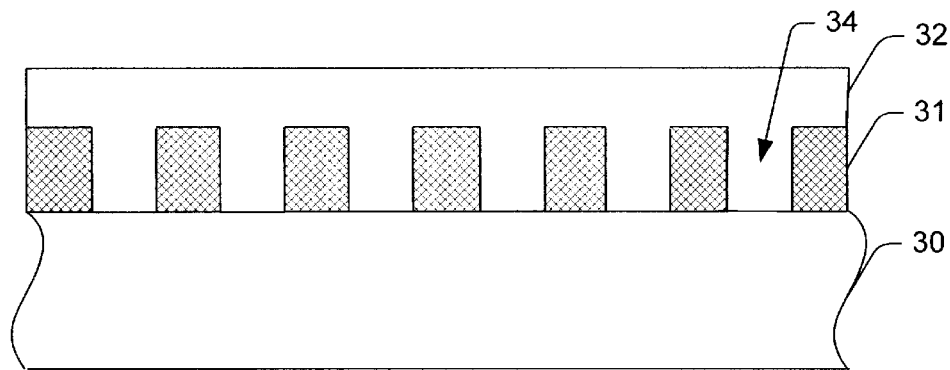
FIG. 4 illustrates a semiconductor substrate having a metal layer formed over and filling trenches formed in an underlying layer.
Figure 5:
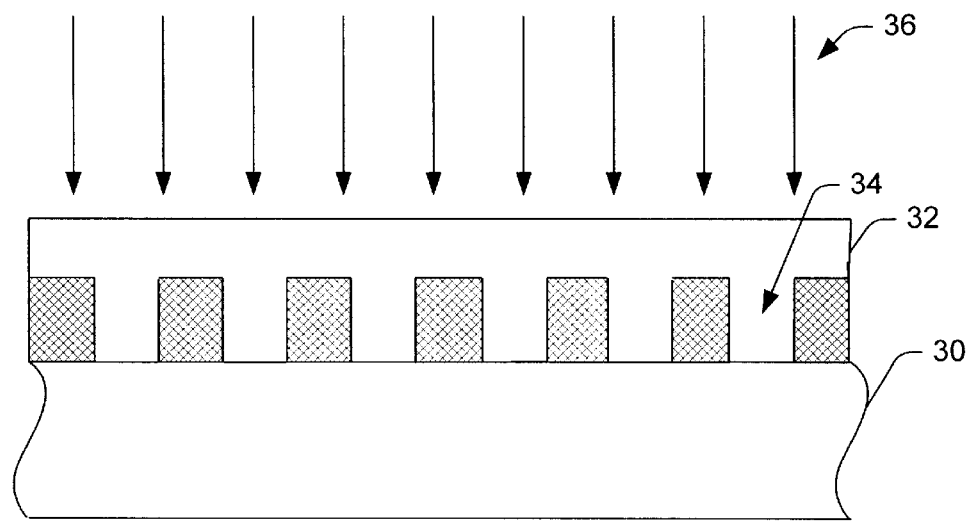
FIG. 5 illustrates the structure of FIG. 4 undergoing a chemical mechanical polishing process according to a prior art process.
Figure 6:
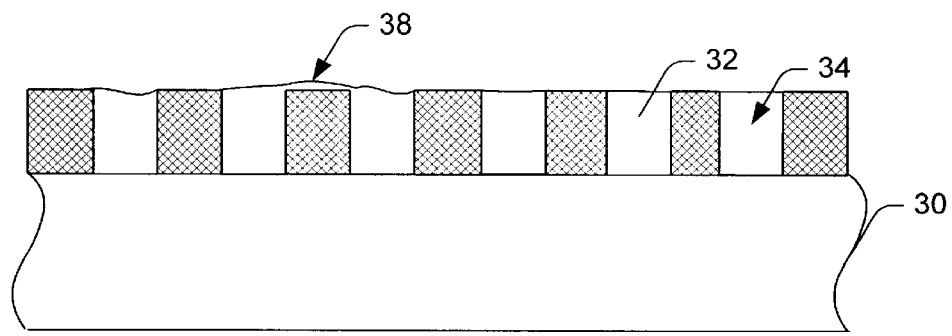
FIG. 6 illustrates the structure of FIG. 5 after the prior art process is substantially completed.

The present invention involves a system and method for monitoring a subtractive metallization process in order to facilitate determining an endpoint for the process using real-time data collected from the process as it progresses. This is accomplished in part by employing a wafer having at least one electrical activity sensor embedded on or in the wafer and programmed to sense an electrical signal (e.g., current flow, resistance) on the wafer. More specifically, the system includes an electrical measurement station which receives electrical activity detected in the metal layer of the wafer by the electrical sensor. The presence of electrical activity in the metal layer of the wafer or in particular areas of the metal layer, where removal of the metal is desired, may indicate that the subtractive metallization (etch or polish) process is not completed in those particular areas where activity was recognized. Detection and transmission of the activity by the electrical sensors occurs in real time. This means that as soon as the electrical activity is received by the measurement station, the data is processed and communicated to the process controller and/or process components in order to effectuate an immediate adjustment to the current process. This immediate or real time response by the current process facilitates improving endpoint detection for the current process. Thus, the current wafer is affected. Ultimately, less wafers are damaged and discarded which increases production efficiencies and decreases costs.

Once the wafer displays substantially no electrical activity (e.g., no current flow, no resistance) in a desired location or region, the subtractive metallization process is completed. Examples of subtractive metallization processes include a metal etch process as described below in FIGS. 7–17 and a chemical mechanical polishing process.

Detection of electrical activity may be made by employing at least one electrical sensor and applying a voltage and then testing for current flow. Detection may also be achieved by performing a circuit continuity test between any two sensors such as a first electrical sensor and a second electrical sensor embedded on and/or in the wafer. The two sensors in connection with the metal material may form a completed circuit, thereby creating activity such as a current. The electrical sensor station may then detect for or receive the activity data. If a current flow is detected, then metal exists at least between the two sensors. A user may determine whether metal located at the location between the two sensors is desirable or not. If the metal is not desired at the location, then the process components may be selectively modified to enhance the subtractive metallization process. Such process continues until no electrical activity is detected at locations on the metal layer where polishing or etching is desired.

For example, before or in the early stages of a metal etch process, the wafer may show nearly 100% current flow throughout the metal layer. However, about midway through the metal etch process, the wafer may show about 50% current flow. Essentially, the lower current flow reading means that portions of the metal layer have been removed and thus, there is less metal to conduct a current. In addition, the electrical sensor station locates and/or recognizes the sensors' positions on the wafer; therefore a user may be able to visualize the portions of the metal which are still present and/or which have been removed.

Using electrical activity to determine an endpoint in a subtractive metallization process facilitates achieving over-etch requirements with greater precision and accuracy, thereby resulting in less damage to the wafer, fewer repairs, lower manufacturing costs and greater production efficiency. The present invention may be described with respect to a metal etch subtractive metallization process in FIGS. 7–17 below. However, it is to be understood that other types of subtractive metallization processes are included within the scope of the present invention.

Figure 7:
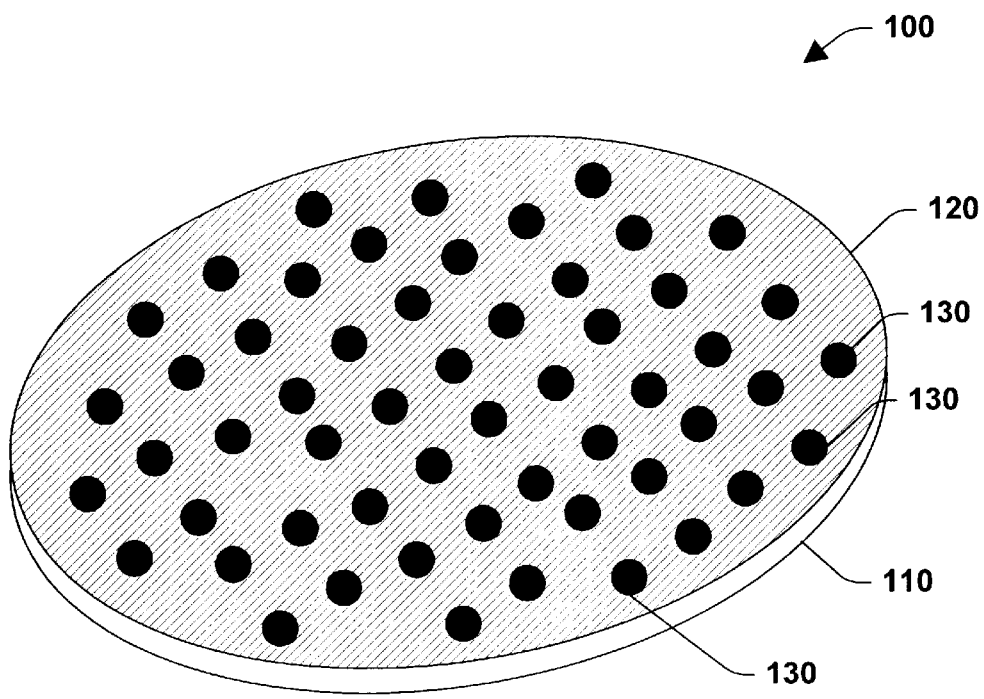
FIG. 7 is a top view of a wafer according to an aspect of the present invention.

Referring to FIG. 7, a top view of a wafer structure 100 according to one aspect of the present invention is shown. The wafer 100 comprises a semiconductor substrate 110 and a metal layer 120 formed over the substrate. It should be understood that one or more intermediate insulating or metallic layers may be formed between the substrate and the metal layer 120. The metal layer 120 may be a conductive or partially conductive material selected from tungsten, tantalum, aluminum, zinc, palladium, copper, gold, silver, titanium, platinum, their silicides, alloys, and any combination thereof. Embedded on or in the wafer 100 is at least one or a plurality of electrical sensors 130. The electrical sensor 130 includes an on-board processor, signal transmitter and power supply. The electrical sensor 130 may be programmed to detect electrical activity such as current flow or resistance on the wafer 100 and particularly in the metal layer 120. In addition, the wafer 100 itself may include an integrated on-board power supply, processing unit and transmitter to relay data to a receiver (FIG. 11) associated with the wafer.

Figure 8:
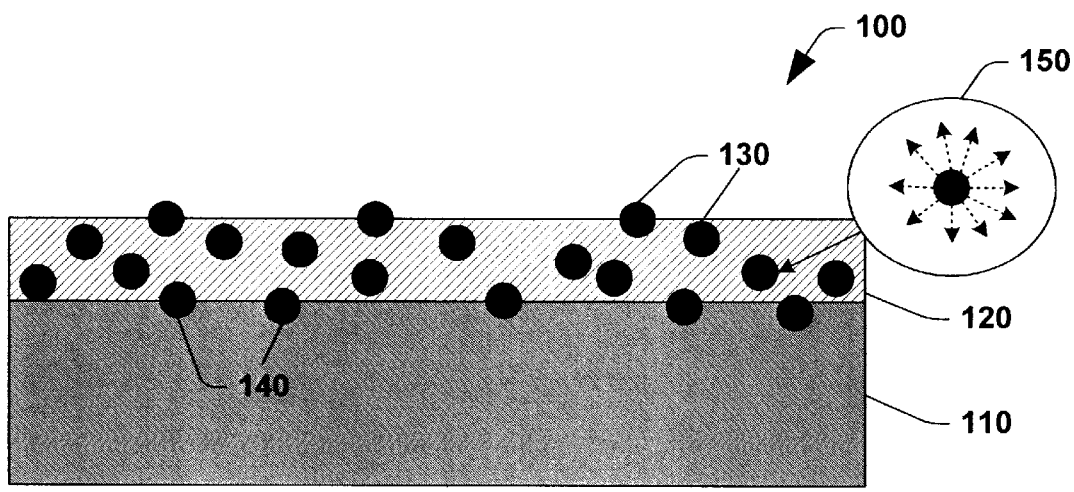
FIG. 8 is a cross sectional view of a wafer according to another aspect of the present invention.

FIG. 8 is a cross-sectional schematic view of the wafer 100 as described in FIG. 7. The electrical sensors 130 can be embedded on and in the wafer. In particular, the sensors 130 may be positioned in or on the metal layer and partially in the metal layer and an underlying layer as shown with sensors 140 in addition, the sensors 130, 140 may be arranged in a random order or at pre-selected locations on and/or in the wafer. Furthermore, the sensors can be programmed to detect electrical activity from all and every direction as illustrated in inset 150.

Figure 9:
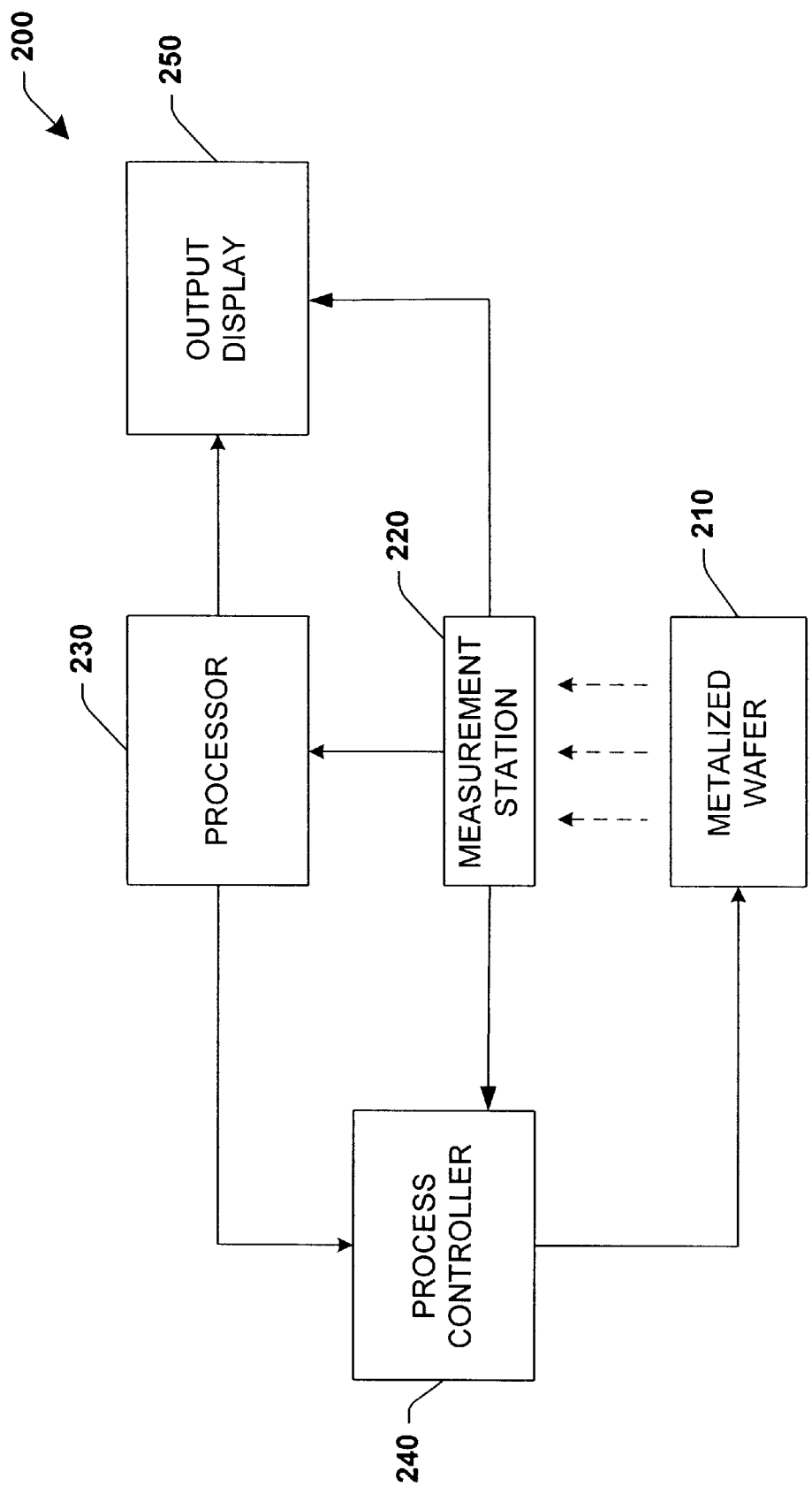
FIG. 9 is a high level schematic block diagram of a system according to an aspect of the present invention.

Turning now to FIG. 9, a system 200 for monitoring a subtractive metallization process in real time is depicted in a high level schematic block diagram according to one aspect of the present invention. The system 200 comprises a metallized wafer 210 (e.g., a metal layer formed over a substrate), a measurement station 220, a station processor 230, a process controller 240 and an output display 250. Each are operatively coupled as shown in FIG. 9. According to one aspect of the system 200, the metallized wafer 210 is subjected to a metal etch process. Before, during and after the etch process is substantially completed, the metallized wafer may be transmitting electrical activity data to the measurement station 220. Depending on the location of the electrical activity on the wafer, such activity may indicate that the current process is not completed yet. That is, metal may still exist in areas of the wafer from where the metal is to be totally removed. A transmission showing no electrical activity detected may indicate that the process in that location is complete. Thus, the sensors provide a progress report of the etch process which indicates where further etching may be needed and/or where etching is completed.

The measurement station 220 can collect the data and translate it into a readable form for a user to visualize the position of the sensors in contact with the wafer and locations of the electrical activity associated with the wafer 210. The collected data can also be communicated to a process controller 240 directly or via a station processor 230. The process controller 240 employs the information to selectively adjust the process components in real time in order to achieve the desired feature on the current wafer by determining a proper end point.

Figure 10:
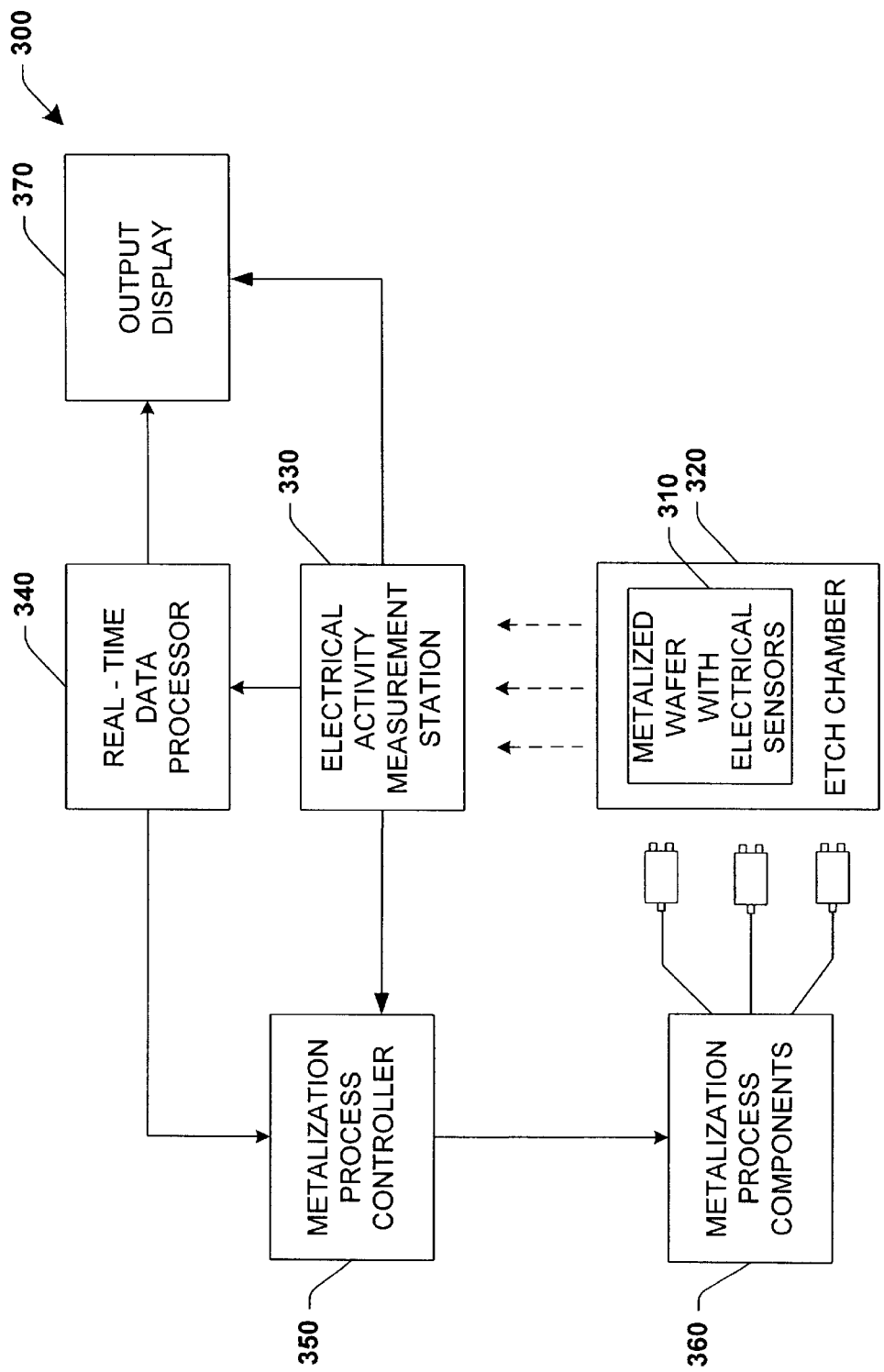
FIG. 10 is a schematic block diagram of a system according to another aspect of the present invention.

FIG. 10 illustrates a schematic block diagram of a system 300 according to another aspect of the present invention. The system 300 monitors a subtractive metallization process in real time so as to immediately effectuate adjustments and modifications in the process to achieve a desired endpoint. The system 300 comprises a metallized wafer 310 placed within an etch chamber 320, an electrical activity measurement station 330, a real time data processor 340, a subtractive metallization process controller 350 and subtractive metallization process components 360. The chamber 320, the measurement station 330, the data processor 340, the controller 350 and the components 360 are operatively connected as shown in the FIG. 10. In addition, the wafer 310 includes one or more electrical activity sensors (not shown) embedded on the wafer and/or embedded in the wafer.

The wafer 310 may also have an on-board or integrated power supply, signal processor and transmitter to relay electrical activity data to the measurement station 330. The on-board power supply may apply a voltage to the metal layer in order to induce electrical activity. Any electrical activity produced can then be detected by the sensors. Alternatively or in addition, the sensors may individually have an integrated power supply, processing unit and transmitter to relay electrical activity data to the measurement station 330. Similar to the wafer, the power supply integrated in the sensor can apply a voltage to the wafer to induce electrical activity. Furthermore, each sensor can detect the applied voltage and include the amount of voltage in its data transmissions.

It is to be appreciated that the applied voltage is an amount sufficient to induce electrical activity in the wafer, depending on the metal composition and thickness, subtractive metallization process and underlying layers and structures formed on the wafer.

According to one aspect of the invention, the metallized wafer 310 is undergoing a metal etch process to form conducting lines. Before, during and after the metal etch process, the electrical sensors embedded on and/or in the wafer transmit signals to the measurement station 330 when electrical activity is detected by the sensors and/or by the measurement station 330 via the sensors. For example, before the metal etch process begins, higher electrical activity may be detected because more metal exists around and between the electrical sensors. As the process progresses and portions of metal are selectively removed, lower electrical activity may be detected. In other words, the metal material must be present around and/or between the sensors in order to produce electrical activity such as current flow and/or resistance readings. The lower electrical activity indicates that less metal material exists around and between the electrical sensors. It is also an indication that the metal etch process is progressing. The measurement station 330 may collect the electrical activity data in real time and transmit it to the processor 340, where it can be further processed into a form usable by the process controller 350. The process controller 350 is operatively connected to the processor and/or the electrical activity measurement station 330 so that it may receive data from either one or both and then determine where adjustments to the metal etch process should be made to optimize the current process. Such determinations are selectively communicated to the subtractive metallization process components 360 and implemented immediately or in real time so that the metallized wafer is etched properly to create the desired conductive wires without exceeding over etch requirements and without prematurely terminating the etch process.

The data or information processed by the data processor 340 may be visualized by the user via an output display 370, which is operatively connected to the measurement station 330 and to the processor 340.

Figure 11:
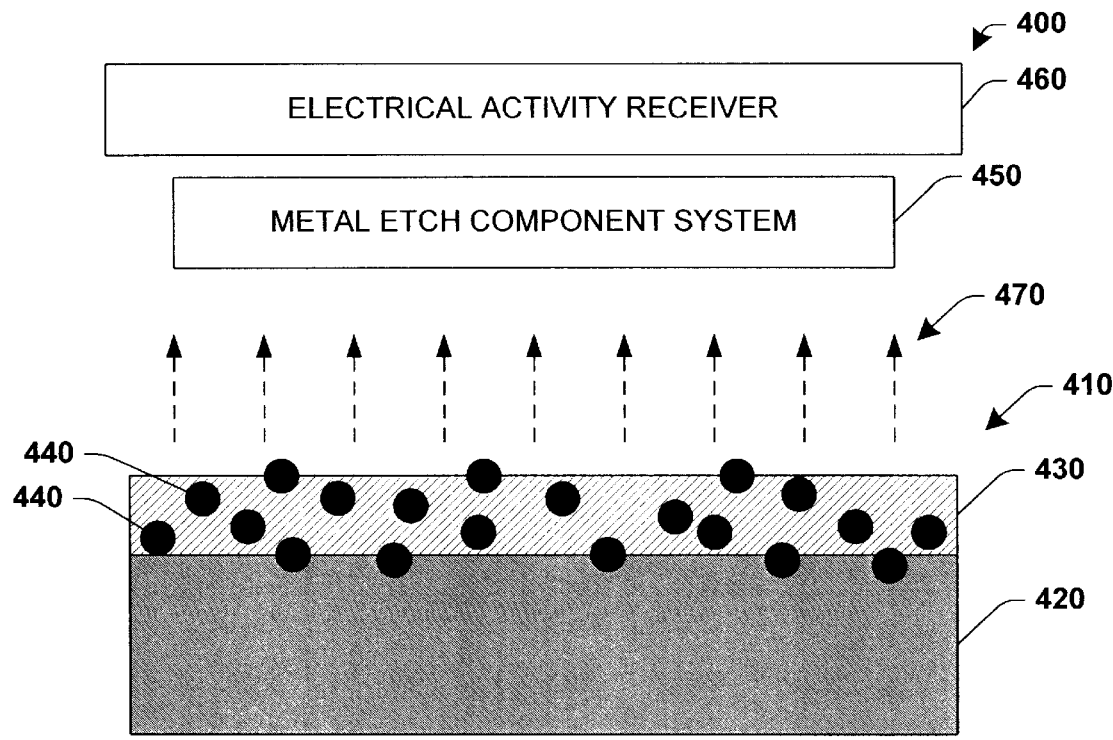
FIG. 11 is a schematic cross sectional view of a wafer employed in a system according to an aspect of the present invention.

Referring now to FIG. 11, one aspect of a system 400 for monitoring a metal etch process in-situ in order to provide real time feedback data to the process is shown in accordance with another aspect of the present invention. The system 400 for monitoring a metal etch (subtractive metallization) process comprises a metalized wafer 410 having a metal layer 430 deposited over a semiconductor substrate 420. The substrate 420 may be composed of any known semiconductor substrate material such as polycrystalline silicon, single crystalline silicon and/or amorphous silicon. The metal layer 430 may be composed of a material such as tungsten, tantalum, aluminum, zinc, palladium, copper, gold, silver, titanium, platinum, their silicides, alloys, or any combination thereof. The thickness of the metal layer 430 may be any thickness suitable to carry out the desired subtractive metallization process. Embedded on and/or in the wafer are one or more electrical activity sensors 440. The sensors 440 individually comprise a power supply, a processing unit and a transmitter (all not shown) and are programmed to sense electrical activity such as current flow and/or resistance on the wafer. In particular, the current flow and/or resistance may be detected within the metal layer 430 since the metal material can conduct the current and yield resistance when a closed circuit is made.

Still referring to FIG. 11, the metal layer 430 is about to be subjected to a metal etch process via a metal etch component system 450. Before the metal etch process begins, the electrical sensors 440 can be monitored by an electrical activity receiver 460 to determine an initial degree, percentage or amount of electrical activity on the wafer 410. This may be accomplished by the sensors 440 transmitting 470 a signal associated with the electrical activity they are sensing to the electrical activity receiver 460. The initial reading or electrical output may be used as a base-line for comparison during and after the metal etch process to determine the progress of the process. For instance, a user may determine that prior to the metal etch process, the wafer 410 exhibits about 100% closed circuits (e.g., shorts). The amount of shorts sensed by the receiver 460 indicates how much metal has been selectively removed and whether additional portions of the metal layer need to be removed to complete the etch process.

It should be appreciated that the sensors 440 may be arranged randomly or in a prescribed order depending on the user and the desired application. In addition, the sensors 440 can be sacrificial which means that a sensor may become deactivated or may be removed with portions of the metal layer during the etch process.

Figure 12:
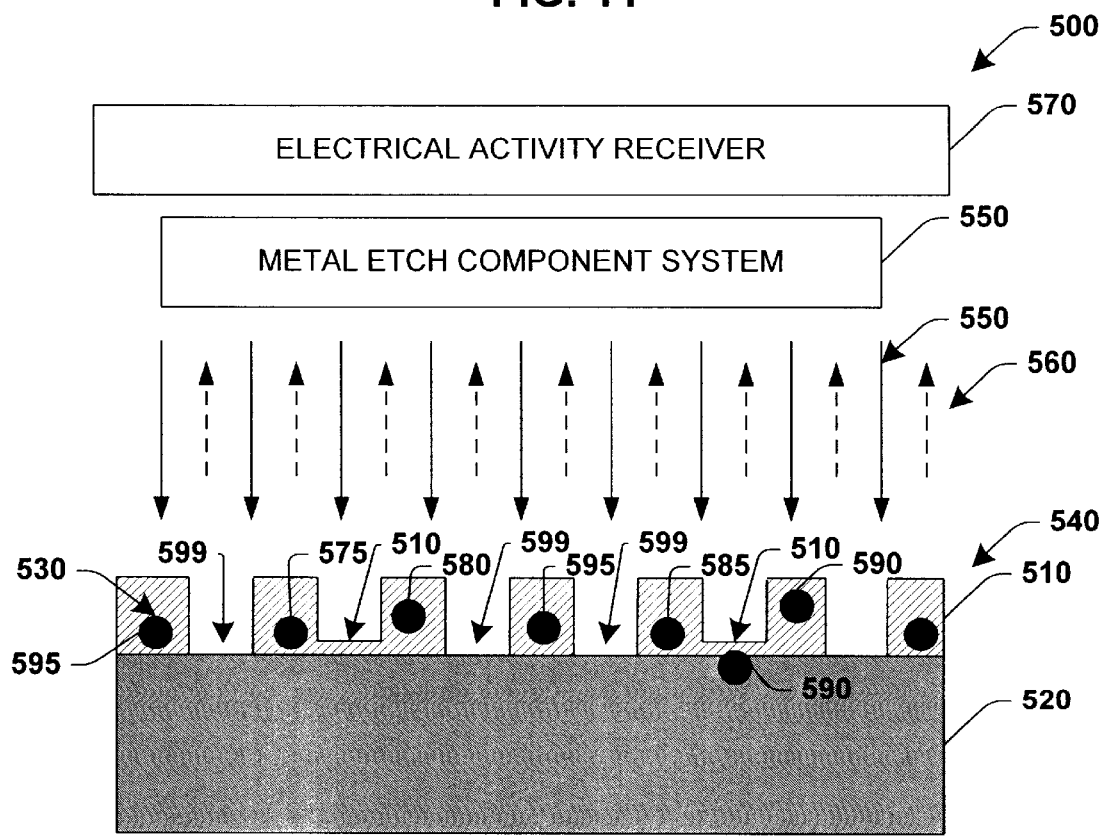
FIG. 12 is a schematic cross sectional view of a wafer employed in a system and method according to another aspect of the present invention.

FIG. 12 illustrates a system 500 similar to the system 400 described in FIG. 11. According to FIG. 12, the metal etch process (indicated by solid arrows 550) has progressed to yield partially etched conductive lines 510 formed over a semiconductor substrate 520. One or more (at least one) electrical sensors 530 are embedded on and/or in the wafer 540. A plurality of electrical sensors comprising at least a first 575 and a second electrical sensor 580 may also be present on the wafer. The sensors 530 may operate individually to detect electrical activity or in concert with at least one other sensor to detect electrical activity. When operating individually, the sensor 530 may detect electrical activity such as current flow occurring around and at the location of the sensor induced by other sensors and/or by applying a voltage via an on-board power supply integrated within the wafer. When two sensors are operating in concert with one another such as the first and second sensors 575, 580, these two sensors may attempt to induce a current flow between themselves. If successful, one of or both first and second sensors can signal that electrical activity has been detected. If no electrical activity is detected, such data is also transmitted.

As can be seen in FIG. 12, fewer sensors 530 may be present on the wafer as the etch process progresses than at the beginning of the process. This is due in part to the selective removal of portions of the metal layer 540 during the etch process. Sensors which have been removed with the etched metal or which have been deactivated as a result of the etching process are not shown.

Still referring to FIG. 12, the electrical sensors 530 continuously or at prescribed intervals transmit (as indicated by dashed arrows 560) electrical activity data to the receiver 570 as the metal etch component system 580 etches the metal layer 510.

Figure 13:
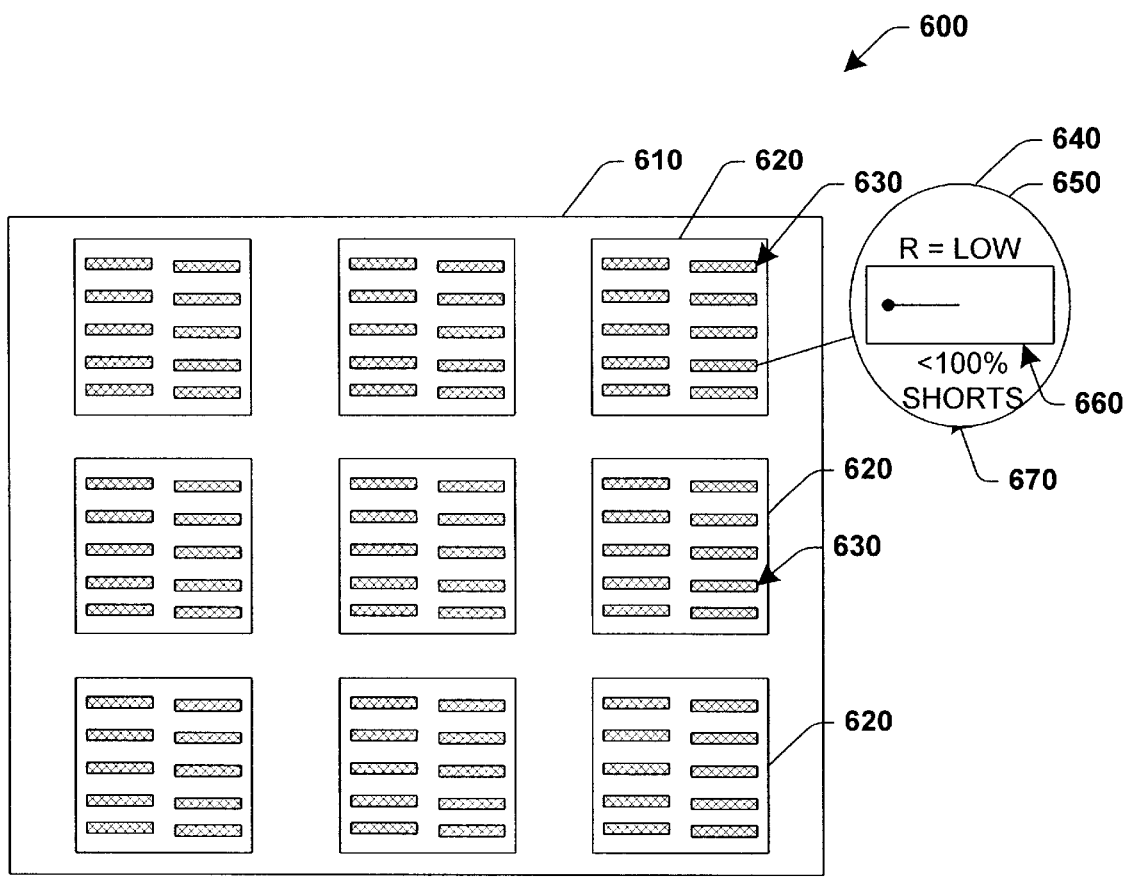
FIG. 13 is a high level schematic illustration of a wafer sheet employed in a system and method according to another aspect of the present invention.

FIG. 13 represents an exemplary output display 600 of a sheet 610 of wafers 620 undergoing a metal etch process. The shaded areas 630 on each wafer 620 represent exemplary areas of the wafer which are being etched 550 and which are transmitting electrical activity data 560 to the receiver 570 (FIG. 12). The type of data transmitted is shown in inset 640. For example, resistance data 650, an array of open/closed circuits 660 detected and/or a percentage of shorts 670 (closed circuits) present at the location of the sensors may be sensed and transmitted to the receiver 570. The data sensed by the electrical sensors may be in any form such as a specific number, a number range, a relative term (e.g., low, high, less than or greater than), a "yes"/"no" response (e.g., "yes" means activity detected), or a pictorial diagram (e.g., array 660). Alternatively or in addition, the electrical activity data may be transmitted to the receiver 570 in the form of a data signal which can then be translated and processed into a more usable form such a number, number range, relative term, "yes"/"no" response and/or a pictorial diagram.

The receiver 570 or a separate data processing unit may process the data to determine where further etching is needed or where etching should be terminated on the wafer. Essentially, the data is detected by the sensors and communicated to the measurement station, processing unit, controller and component system in real time so as to allow immediate modifications to be made and implemented in the current etch process.

As shown in FIGS. 12 and 13, electrical activity is detected between and/or at a first electrical sensor 575 and a second electrical sensor 580 (e.g., also first and second sensors 585, 590). This is because metal material 510 still exists around and between these sensors which permits a current to flow between and through each pair of sensors. By contrast, sensors 595 transmit no electrical activity since there is insufficient metal between it and another sensor to complete a circuit. Consequently, data corresponding to "no electrical activity detected" is transmitted to the receiver 570 (FIG. 12) and ultimately to the component system 550 (FIG. 12). The component system selectively terminates etching at particular locations 599 where no further etching is needed.

Figure 14:
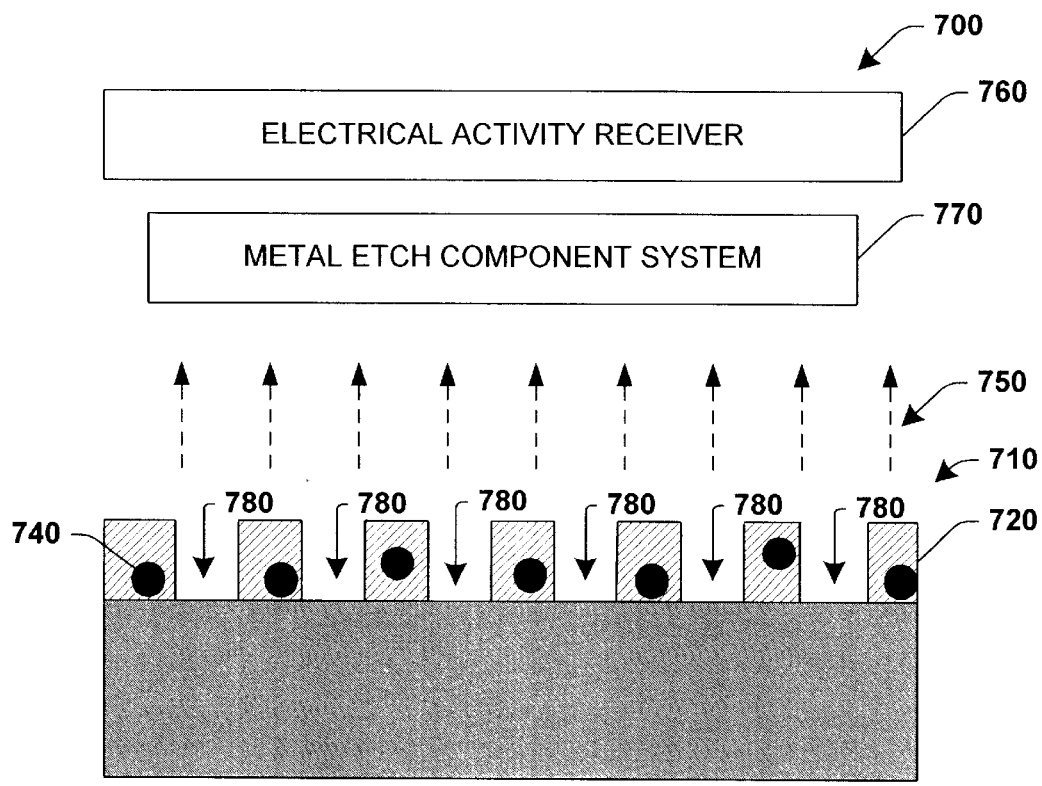
FIG. 14 is a schematic cross sectional view of the structure of FIG. 12 following a subtractive metallization process and real time monitoring according to another aspect of the present invention.
Figure 15:
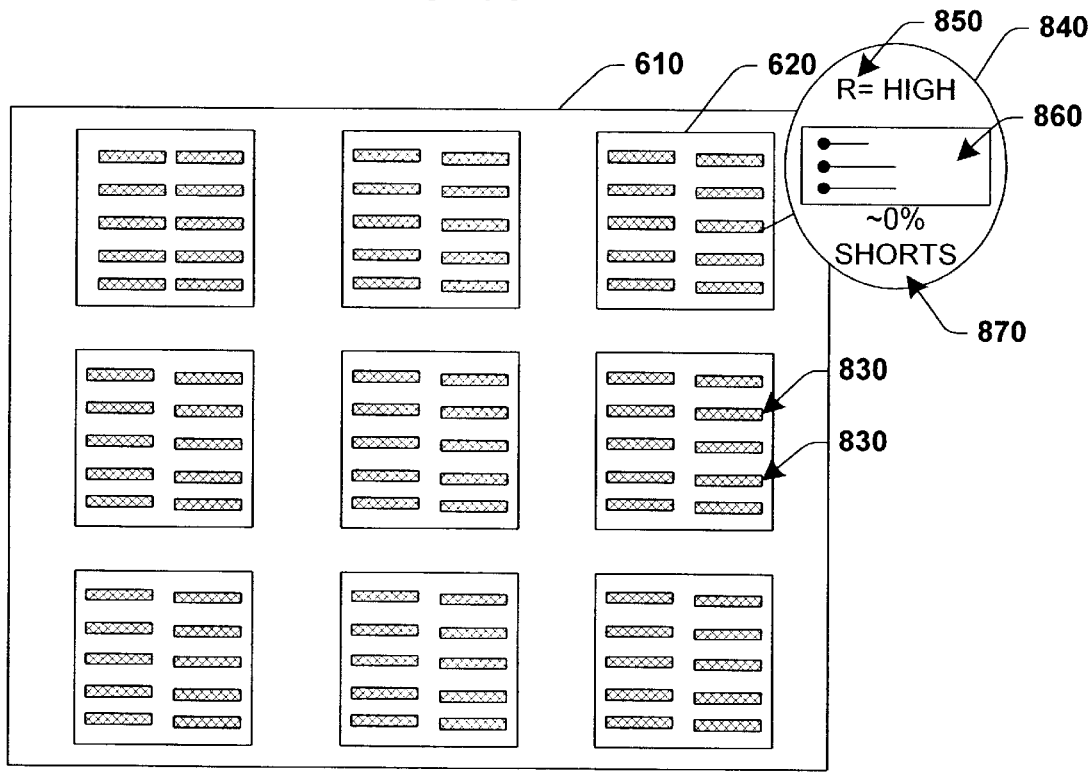
FIG. 15 is a high level schematic illustration of the structure of FIG. 14 according to an aspect of the present invention.

Turning now to FIGS. 14 and 15, another aspect of the present invention is shown. A system 700 for monitoring a subtractive metallization process shows a wafer 710 with conductive lines 720 formed in substantial part over a substrate 730 after the metal etch process has been completed. Completion of the metal etch process can be determined by the electrical sensors 740. When the electrical sensors 740 transmit 750 data reflecting that no electrical activity is detected (as shown in FIG. 15 at inset 840) either on the wafer or at selected locations 780 on the wafer where etching was desired, the electrical activity receiver 760 communicates to the metal etch component system 770 to terminate the etch process.

FIG. 15 illustrates in greater detail an exemplary output display 800 associated with the wafer 710 (FIG. 14). In particular, shaded areas 830 on each wafer 620 represent exemplary areas on the wafer which have undergone an etch process and now do not indicate electrical activity either on the wafer or at selected locations on the wafer, or both, where metal removal was desired. The data transmitted by the sensors to the electrical activity receiver is shown in the inset 840. For example, high resistance 850, an array 860 of open circuits and about 0% shorts 870 (e.g., no closed circuits) indicates that there is at least no electrical activity at the selected locations/portions of the wafer where removal of the metal was desired. According to the present invention, the data 840 can be transmitted to the receiver and then subsequently communicated to the metal etch component system. Because no electrical activity was present at the desired locations of the wafer or on the wafer in general, the component system was signaled to end the etch process, thereby minimizing over etch defects and damage to features formed on the wafer caused by over-exposure to the etch components.

Figure 16:
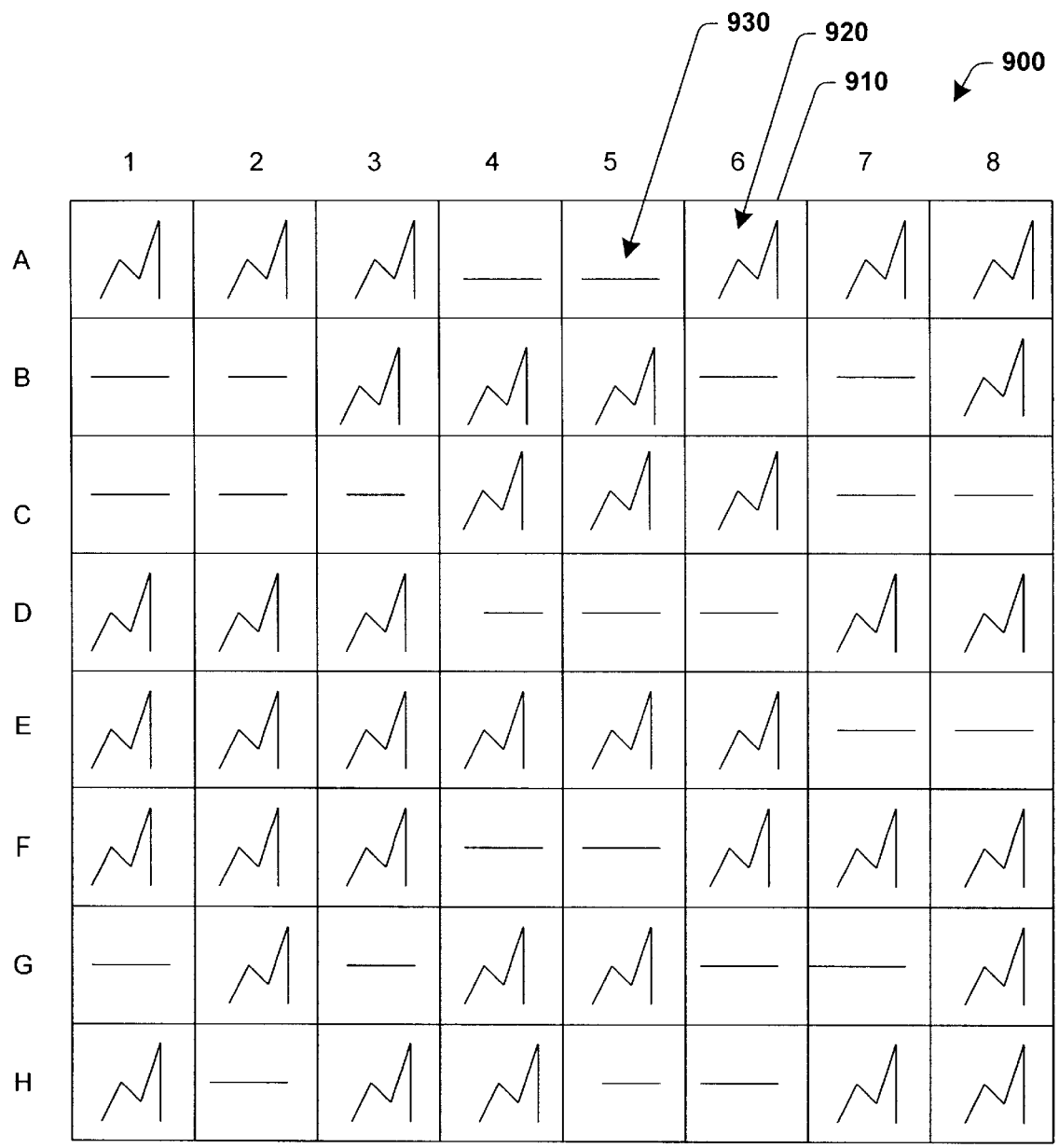
FIG. 16 is a high level schematic illustration of an output display according to an aspect of the present invention.

FIG. 16 is another exemplary output display 900 according to the present invention. The display 900 is in a grid or matrix form and permits a user to visualize the progression of the etch process. For example, a wafer may be divided into a matrix form composed of blocks 910 (A1–A8 . . . H1–H18). The location of the electrical sensors may also be noted and correspond to at least one particular matrix block 910. A signal 920 may indicate electrical activity whereas a flat line 930 may indicate no electrical activity at the sensor(s).

Figure 17:
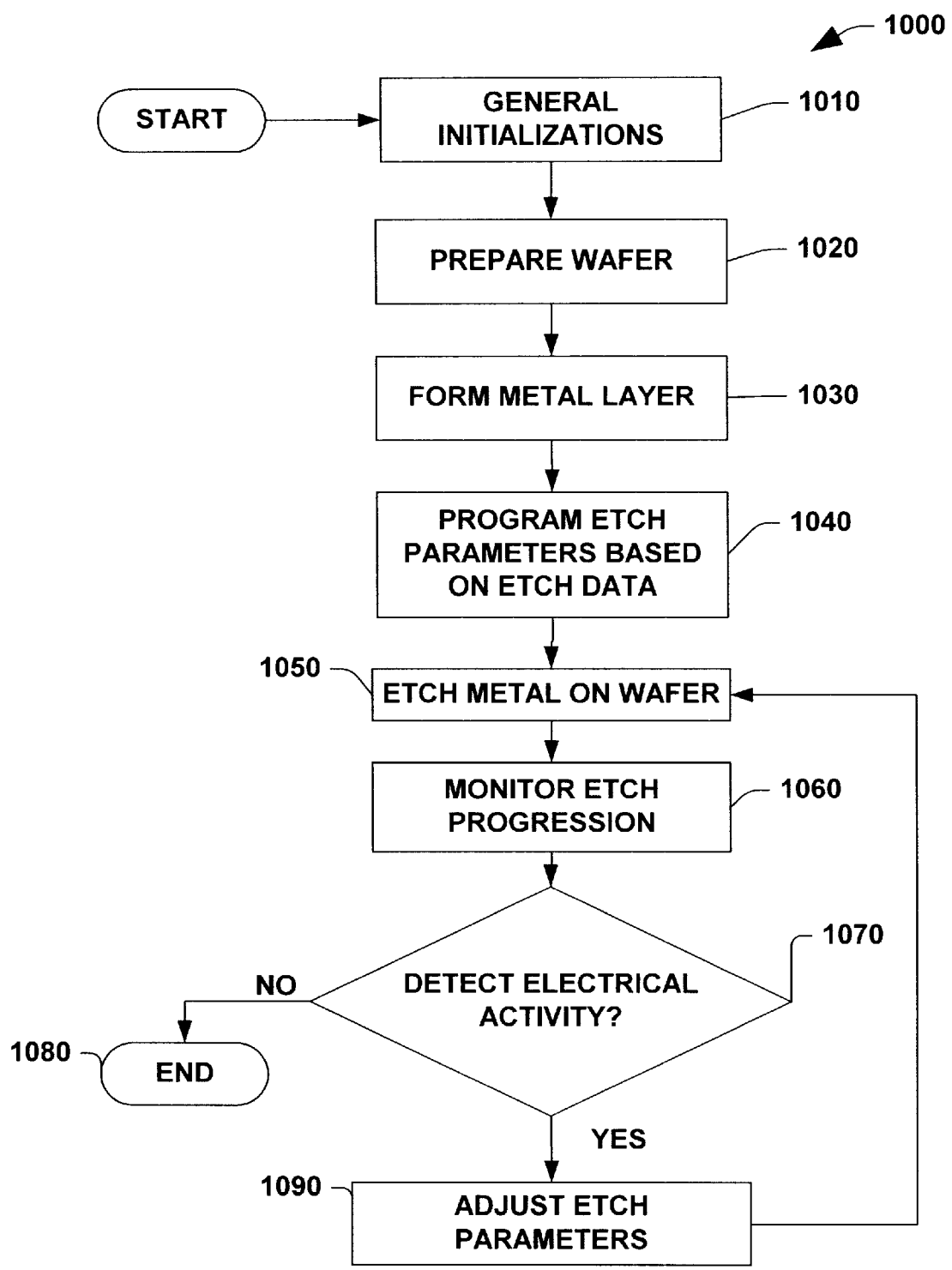
FIG. 17 is a schematic flow diagram of a method according to another aspect of the present invention.

Turning now to FIG. 17, a flow diagram is shown according to an exemplary method 1000 to monitor a subtractive metallization process in real time in order to effectuate immediate adjustments in an on-going process in connection with closed loop feedback control. For example, general initializations are made at 1010 to accommodate a desired subtractive metallization process about to be performed. The subtractive metallization process may include metal deposition followed by a metal etch process or a chemical mechanical polishing process. A wafer is prepared for the process at 1020. Such preparation may include substrate formation, deposition of intermediate insulative layers, rinsing and the like. At 1030, a metal layer is formed over the substrate. The metal material may be any one of tungsten, tantalum, aluminum, zinc, palladium, copper, gold, silver, titanium, platinum, their silicides, alloys, or any combination thereof. The metal layer may be deposited as a uniform layer or it may be used to fill trenches, vias, contacts holes and the like. In the latter form, the excess metal can be polished away via a chemical mechanical polishing process in connection with the real time monitoring system and method described herein.

Appropriate etch parameters may be programmed into the etch system based on desired etch results, known wafer variations and the like at 1040. In addition, electrical activity on the wafer may be measured at an early stage such as before the etch process begins to determine a base line reading for later comparison. Subsequently, the metal layer is etched at 1050. The metal etch process can be monitored at 1060 by employing one or more electrical sensors which are embedded on and/or in the wafer. The electrical sensors operate to detect electrical activity associated with the wafer (1070). If no electrical activity is detected, then the etching process stops (1080). Otherwise, the etch parameters are adjusted (1090) according to the location of the detected electrical activity and the etch process continues (loop back to 1050). The etch process may continue at locations on the wafer still experiencing electrical activity where no activity, and thus no metal material, is desired. Thus, the adjustments to the etch parameters are selectively made in real time so as to elicit a change in the etch process immediately and during the current etch process. The electrical activity decreases as the metal etch process progresses, indicating that selected portions of the metal layer are being removed as desired to form features/structures on the wafer. It should be appreciated that a wafer having fully formed metal features may still exhibit electrical activity depending on placement of the sensors since metal is still present on the wafer. However, the etch process terminates when no electrical activity is detected at the portions of the metal layer which are selected for removal.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A system for monitoring a subtractive metallization process in real-time, comprising:

a wafer comprising at least one metal layer formed on a semiconductor substrate;

at least one electrical sensor in contact with the wafer and operable to detect and transmit electrical activity associated with the wafer, wherein the at least one electrical sensor is at least one of embedded on the metal layer and embedded in the metal layer; and an electrical measurement station operable to process electrical activity data detected and received from the electrical sensor for monitoring a subtractive metallization process in real-time.

2. The system of claim 1, wherein the electrical sensor comprises a power supply, a signal processor, and a transmitter to relay the electrical activity associated with the wafer to a receiver.

3. The system of claim 2, wherein the electrical sensor is operable to detect at least one of a current flow or a resistance when at least a portion of the sensor contacts the metal layer.

4. The system of claim 1, wherein the wafer comprises an on-board power supply, processor, and transmitter to relay the electrical activity detected from the wafer to a receiver.

5. The system of claim 1, wherein the electrical activity data comprises a number, a pictorial diagram, a "yes" indicator, and a "no" indicator.

6. The system of claim 1, wherein the electrical sensor is operable to detect electrical activity comprising at least one of current flow and resistance and to detect a voltage applied to induce the activity.

7. The system of claim 1 further comprising a plurality of electrical sensors associated with the wafer comprising at least a first electrical sensor and a second electrical sensor, which are at least one of embedded on the wafer and embedded in the wafer.

8. The system of claim 7, wherein the plurality of electrical sensors are arranged in at least one of a random order and at pre-selected locations.

9. The system of claim 7, wherein the first electrical sensor electrically communicates to a second electrical sensor to form a closed circuit.

10. The system of claim 9, wherein the metal layer material acts as the conductive material to complete the circuit and the closed circuit is formed only in the presence of the metal layer material between the first and the second electrical sensors.

11. The system of claim 1, wherein the electrical measurement station processes the detected electrical activity to determine the location of the electrical activity on the wafer.

12. The system of claim 1, wherein electrical activity is detected when metal is present at the location associated with the electrical sensor.

13. The system of claim 1, wherein the subtractive metallization process is a metal etch process.

14. The system of claim 1, wherein the subtractive metallization process is a chemical mechanical polishing process.

* * * * *